US006948146B2

(12) United States Patent
Allen et al.

(10) Patent No.: US 6,948,146 B2
(45) Date of Patent: Sep. 20, 2005

(54) SIMPLIFIED TILING PATTERN METHOD

(75) Inventors: Robert J. Allen, Jericho, VT (US);
John M. Cohn, Richmond, VT (US);
Peter A. Habitz, Hinesburg, VT (US);
William C. Leipold, Enosburg Falls, VT (US); Ivan L. Wemple, Shelburne, VT (US); Paul S. Zuchowski, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 288 days.

(21) Appl. No.: 10/248,324

(22) Filed: Jan. 9, 2003

(65) Prior Publication Data

US 2004/0139417 A1 Jul. 15, 2004

(51) Int. Cl.[7] ............................................... G06F 17/50
(52) U.S. Cl. ............................. 716/13; 716/12; 716/14
(58) Field of Search ........................... 716/8–15, 19–21; 438/128–132, 622–633; 257/202–211, 758

(56) References Cited

U.S. PATENT DOCUMENTS

| | | | | | |
|---|---|---|---|---|---|
| 5,278,105 | A | * | 1/1994 | Eden et al. | 438/129 |
| 5,742,086 | A | * | 4/1998 | Rostoker et al. | 257/300 |
| 5,790,417 | A | * | 8/1998 | Chao et al. | 716/21 |
| 5,822,214 | A | * | 10/1998 | Rostoker et al. | 716/10 |
| 5,923,563 | A | * | 7/1999 | Lavin et al. | 716/19 |
| 6,344,409 | B1 | * | 2/2002 | Jaso et al. | 438/633 |
| 6,499,135 | B1 | * | 12/2002 | Li et al. | 716/19 |
| 6,690,025 | B2 | * | 2/2004 | Won et al. | 257/3 |
| 6,847,457 | B2 | * | 1/2005 | Tobiason et al. | 356/495 |
| 2003/0229875 | A1 | * | 12/2003 | Smith et al. | 716/10 |

* cited by examiner

Primary Examiner—Matthew Smith
Assistant Examiner—Naum Levin
(74) Attorney, Agent, or Firm—Richard M. Kotulek

(57) ABSTRACT

The invention provides a design and an integrated circuit having a substantially uniform density and electrical characteristics between parts of the IC that are angled at 45 degrees relative to one another. In particular, the invention provides fill tiling patterns oriented substantially uniformly to electrical structures of either orthogonal or 45 degree angle orientation.

22 Claims, 4 Drawing Sheets

SIMPLIFIED TILING PATTERN METHOD

BACKGROUND OF THE INVENTION

1. Technical Field

The present invention relates generally to fill tiling patterns for an integrated circuit.

2. Background Art

Current integrated circuit (IC) manufacturing techniques benefit from a uniform density of wiring or conductors within a layer. For example, uniform density is required to prevent different amounts of wear across a plane during chemical mechanical polishing. To provide uniform density, various techniques for filling of empty spaces have been developed. See, for example, U. S. Pat. Nos. 5,278,105 (Eden et al.), 5,341,310 (Gould et al.) or 5,923,563 (Lavin et al.).

One challenge in providing uniform density of wiring within a plane is addressing the effect of fill tiling patterns on the electrical properties, i.e., fill tiles acting as fringe capacitance, on an adjacent wire. In particular, fill tiles add complexity to the electrical analysis of the circuit because each shape represents a floating conductor coupled by capacitors to the wire. As a result, the fill tiles change the overall capacitance between the connected wires of the circuit, and modify the electrical analysis result. Conventionally, fill tile patterning is addressed by predicting the electrical impact of the fill tiles relative to all electrically significant shapes. By mathematically accounting for the impact of the fill tiles, new capacitances between the connected circuits can be established and then fitted to modified expressions. One conventional technique for predicting the impact of fill tiles is to assume a uniform fill tile environment around shapes based on the predicted behavior of the fill tile pattern creation program. This technique is used because it takes into account the fill tile pattern without increasing the amount of computational resources required to analyze the layout compared to actually adding the fill tiles to the layout.

This uniform fill tile pattern assumption, historically, yields acceptable results because of the orthogonal nature of the wiring and the use of square fill tiles. That is, most wiring has an orthogonal layout (i.e., wires meet at right angles) and the fill tiles are oriented parallel thereto. Advancements in processing technology, however, are now making mixed non-orthogonal and orthogonal wiring patterns possible. Unfortunately, the provision of mixed orthogonal and non-orthogonal wiring with orthogonal fill tile patterns makes the fill tile environment non-uniform relative to the wiring. Accordingly, consistent assumptions about the impact on electrical properties of the fill tile patterns are no longer possible. To illustrate, FIG. 1 shows an IC including orthogonal and non-orthogonal wiring and an orthogonal fill tiling pattern throughout. In this situation, one can assume for analysis a uniform environment across much of the IC because of the orthogonal nature of the wiring and fill tiles. However, because the distance of the tiling pattern from the non-orthogonal (diagonal) wire varies along the wire's length, a number of additional parameters for each non-orthogonal wire segment must be known in order to make valid assumptions. For example, the precise length, the corresponding periodicity and angle of the fill, and the impact on the electrical properties must be ascertained for each segment of non-orthogonal wire. Consideration of all of these parameters makes analysis of the impact of the orthogonal fill tiling on the adjacent non-orthogonal wiring impracticable.

In view of the foregoing, there is a need in the art for a method for providing a substantially uniform density and electrical characteristics for an integrated circuit having mixed orthogonal and non-orthogonal electrical structure.

BRIEF SUMMARY OF THE INVENTION

The invention relates to fill tiling of wiring patterns. Typical non-orthogonal wiring patterns involve the use of wires constrained to 45 degrees relative to orthogonal wires. This constraint simplifies the problem of providing a tiling pattern which results in uniform electrical characteristics for all wires. The invention provides a method for providing a substantially uniform density and electrical characteristics between parts of an IC that are either orthogonal or angled at 45 degrees relative to one another. The invention does so by providing an integrated circuit design or integrated circuit including at least one layer having a first electrical structure angled at 45 degrees relative to a second electrical structure, wherein the fill tiles in the tiling pattern in combination with the first and second electrical structures provide a substantially uniform density and electrical characteristics across a respective layer of the IC.

The foregoing and other features of the invention will be apparent from the following more particular description of embodiments of the invention.

BRIEF DESCRIPTION OF THE SEVERAL VIEWS OF THE DRAWINGS

The embodiments of this invention will be described in detail, with reference to the following figures, wherein like designations denote like elements, and wherein.

DETAILED DESCRIPTION OF THE INVENTION

Best Mode(s) for Carrying Out the Invention

Figure 1:
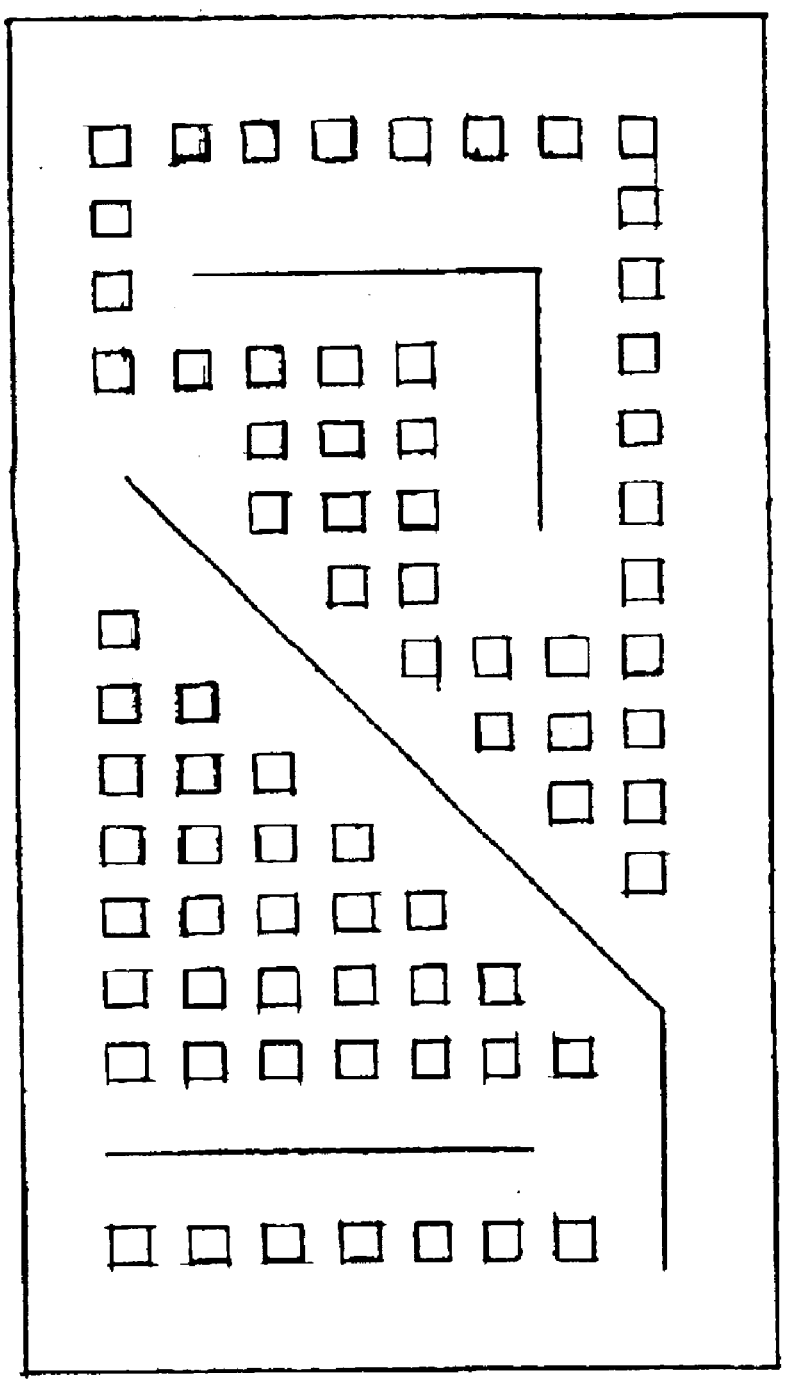
FIG. 1 shows a layer of a prior art integrated circuit having orthogonal fill tiling patterns positioned between mixed orthogonal and 45 degree wire segments.
Figure 2:
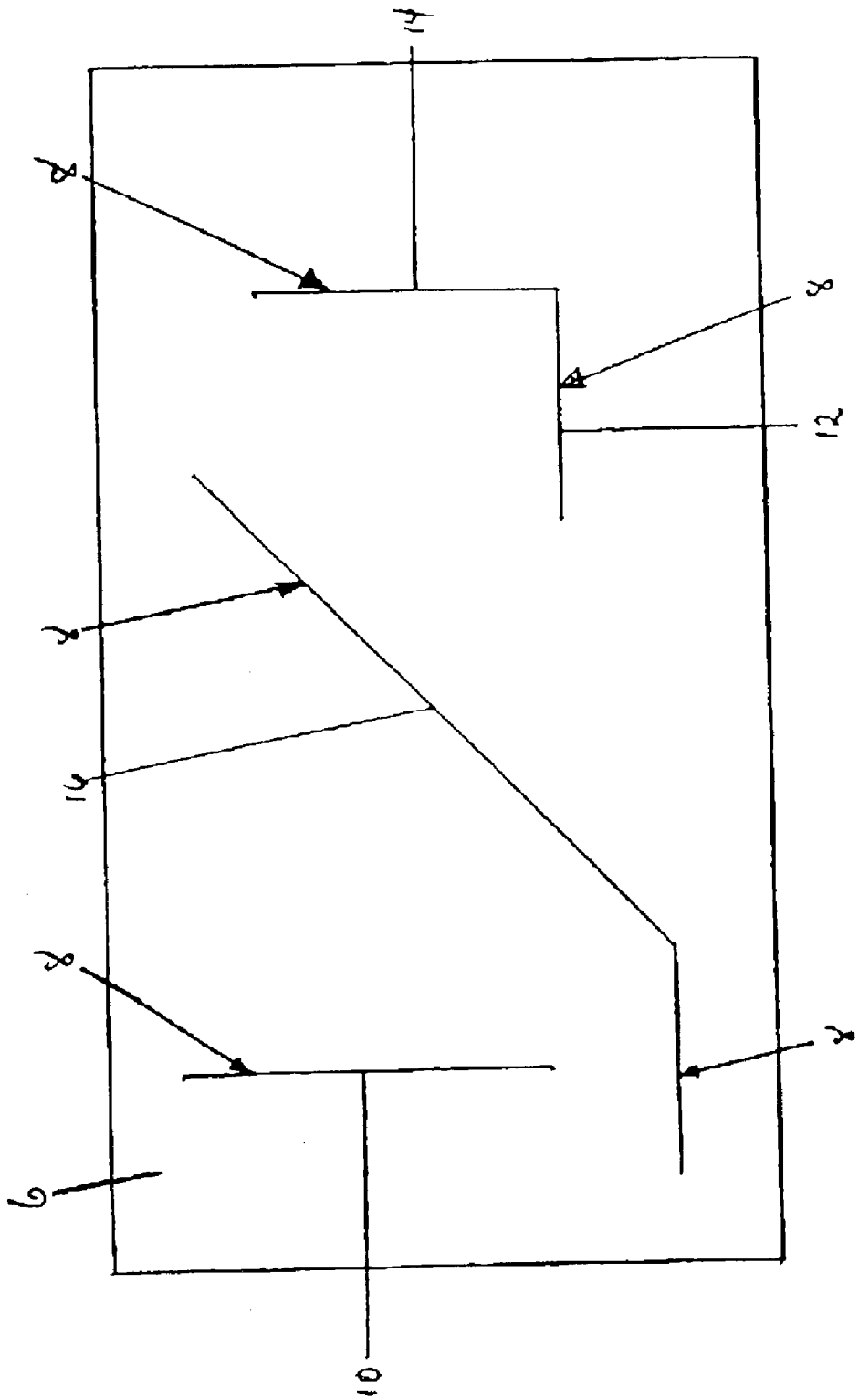
FIG. 2 shows a layer an integrated circuit including open regions for tiling.

With reference to the accompanying drawings, FIG. 2 shows a layer of an integrated circuit (IC) 6 including, inter alia, a number of electrically impressionable parts 8. By "impressionable" is meant that the parts are susceptible to environmental influences that can alter their electrical properties. Hereinafter, electrically impressionable parts 8 will be described as wire segments 10, 12, 14, 16. It should be recognized, however, that parts 8 may be any structure of IC 6 that is electrically impressionable such as resistors, wells, power bus segments, shielding structures, ground planes, wave guides, etc. In one embodiment, wire segments 10, 12, 14 may be considered orthogonal because of their relation to each other and/or other structure of IC 6 (e.g., a "top" surface 18), and segment 16 may be considered non-orthogonal because of its 45 degree angle to segments 10, 12, 14 or other structure of IC 6. It should be recognized that while a particular structural (i.e., wiring) pattern has been illustrated, the invention is applicable to practically any structural pattern (electrical part layout) where segments are angled at 45 or 90 degrees relative to each other or other IC structure.

The invention provides a substantially uniform density between parts 8 with fill tiling shapes by substantially matching the tiling patterns to the orientation of parts. As used herein a "fill tile" or just "tile" shall refer to a conductive shape that is added to an area of an IC that does not include other structure, such as wiring, to provide a substantially uniform density for the area. As known in the art, fill tiles can be repeated to form patterns to provide a substantially uniform density over wider areas.

Figure 3:
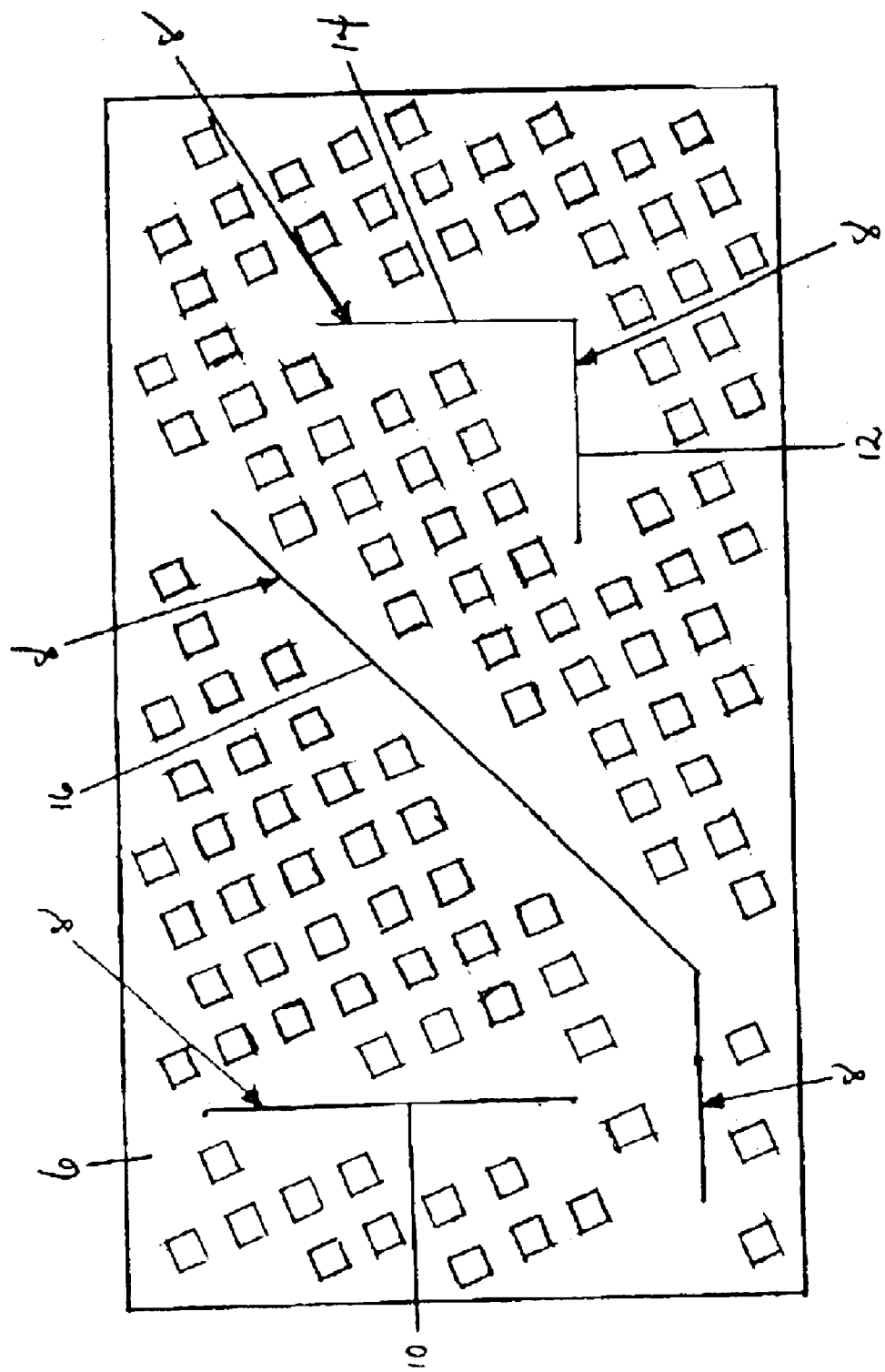
FIG. 3 shows the layer of FIG. 2 including a first fill tiling pattern which provides uniform electrical characteristics for both orthogonal and 45 degree wires.

With reference to FIG. 3, a tile pattern consisting of square tiles rotated relative to the orthogonal wires by 22.5 degrees provides a uniform pattern with identical electrical characteristics for both orthogonal and 45 degree wires. This pattern could be generated by using the techniques used to generate standard fill tiles (i.e., shapes with vertical and horizontal edges) but replacing the standard fill tile with one rotated by 22.5 degrees. Some computer-aided-design (CAD) programs may not support the use of shapes with the 22.5 degree orientation.

Figure 4:
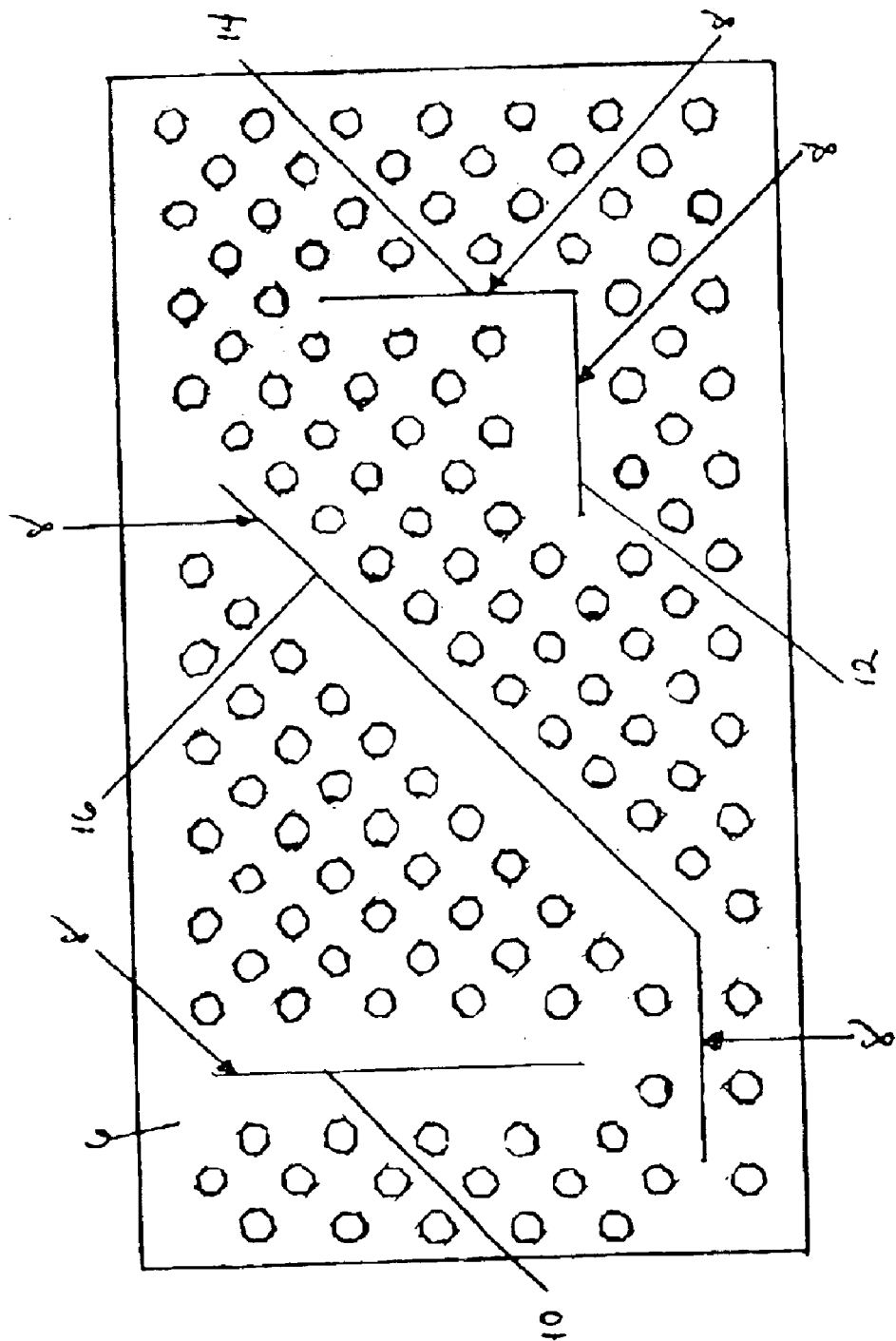
FIG. 4 shows the layer of FIG. 2 including a second fill tiling pattern which provides uniform electrical characteristics for both orthogonal and 45 degree wires.

With reference to FIG. 4, a tile pattern consisting of octagonal tiles provides a uniform pattern with identical electrical characteristics for both orthogonal and 45 degree wires. The use of octagonal tiles is consistent with commonly used CAD programs for IC design. This pattern could be generated by using the techniques used to generate standard fill tiles (i.e., shapes with horizontal and vertical edges) but replacing the standard square fill tile with an octagon of the same or nearly the same area.

Circular tiles could be used to provide a uniform tiling pattern for wires of any orientation but circular shapes are not supported by some CAD programs and their use complicates the electrical analysis unnecessarily. This pattern could be generated by using the techniques used to generate standard fill tiles (i.e., shapes with horizontal and vertical edges) but replacing the standard square fill tile with a circle of the same or nearly the same area.

It should be recognized that the teachings of the invention as described above can be repeated for each layer of IC 6.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

INDUSTRIAL APPLICABILITY

The invention is useful for providing a substantially uniform density in a layer of an integrated circuit having electrical structure that is angled at 45 or 90 degrees relative to other electrical structure.

What is claimed is:

1. An IC including at least one layer having a first electrical structure angled at 45 degrees relative to a second electrical structure, wherein tiles in a tiling pattern in combination with the first and second electrical structures provide a substantially uniform density and electrical characteristics across a respective layer of the IC, and further wherein the tiles have a first edge segment oriented at 22.5 degrees relative to the first electrical structure and a second edge segment oriented at 22.5 degrees relative to the second electrical structure.

2. The IC of claim 1, wherein the first second electrical structure is provided orthogonally relative to a plurality of electrical structures of the IC, and the first electrical structure is provided at a 45 degree angle to the plurality of electrical structures of the IC, wherein a size and orientation of each tiling pattern is constant within a respective tiled area.

3. The IC of claim 2, wherein the first and second electrical structures are wire segments.

4. The IC of claim 2, wherein the tiling pattern consists of square tiles.

5. IC of claim 2, wherein the tiling pattern consists of octagonal tiles with a third edge segment parallel to the first electrical structure and a fourth edge segment parallel to the second electrical structure.

6. The IC of claim 2, wherein the electrical structure between tiles in the tile pattern and the first electrical structure is identical to the electrical interaction between the tiles in the tile pattern and the second electrical structure.

7. The IC claim 1, wherein the first and second electrical structures are wire segments.

8. The IC claim 1, wherein the tiling pattern consists of square tiles.

9. The IC of claim 1, wherein the tiling pattern consists of octagonal tiles with a third edge segment parallel to the first electrical structure and a fourth edge segment parallel to the second electrical structure.

10. The IC of claim 1, wherein the electrical interaction between the tiles in the tile pattern and the first electrical structure, is identical to the electrical interaction between the tiles in the tile pattern and the second electrical structure.

11. An IC design including at least one layer having a first electrical structure angled at 45 degrees relative to a second electrical structure, wherein tiles in a tiling pattern in combination with the first and second electrical structures provide a substantially uniform density and electrical characteristics across a respective layer of the IC, and further wherein the tiles have a first edge segment oriented at 22.5 degrees relative to the first electrical structure and a second edge seats oriented at 22.5 degrees relative to the second electrical structure.

12. The IC design of claim 11, wherein the first electrical structure is provided orthogonally relative to other structures of the IC, and the second electrical structure is provided at a 45 degree angle to other structures of IC, wherein a size and orientation of each tiling pattern is constant within a respective tiled area.

13. The IC design of claim 12, wherein the first and second electrical structures are wire segments.

14. The IC design of claim 12, wherein the tiling pattern consists of square tiles.

15. The IC design of claim 12, wherein the tiling pattern consists of octagonal tiles with a third edge segment parallel to the first electrical structure and a fourth edge segment parallel to the second electrical structure.

16. The IC design of claim 12, wherein the electrical interaction between the tiles in the tile pattern and the first electrical structure is identical to the electrical interaction between the tiles in the tile pattern and the second electrical structure.

17. The IC design of claim 11, wherein the first and second electrical structures are wire segments.

18. The IC design of claim 11, wherein the tiling pattern consists of square tiles.

19. The IC design of claim 11, wherein the tiling pattern consists of octagonal tiles with a third edge segment parallel to the first electrical structure and a fourth edge segment parallel to the second electrical structure.

20. The IC design of claim 11, wherein the electrical interaction between the tiles in the tile pattern and the first electrical structure, is identical to the electrical interaction between the tiles in the tile pattern and the second electrical structure.

21. A method of designing tiling patterns for an IC including at least one layer having a first electrical structure angled at 45 degrees relative to a second electrical structure, comprising the step of:

applying a tiling pattern to the layer of the IC, the tiling pattern comprising square tiles having a first edge segment oriented at 22.5 degrees relative to the first electrical structure and a second edge seats oriented at 22.5 degrees relative to the second electrical structure.

22. A method of designing tiling patterns for an IC including at least one layer having a first electrical structure angled at 45 degrees relative to a second electrical structure, comprising the step of:

applying a tiling pattern to the layer of the IC, the tiling pattern comprising octagonal tiles with one side parallel to the first electrical structure, a second side parallel to the second electrical structure, a third side oriented at 22.5 degrees relative to the first electrical structure and a fourth side oriented at 22.5 degrees relative to the second electrical structure.

* * * * *